(12) United States Patent
Hrubes

(10) Patent No.: US 7,265,542 B2
(45) Date of Patent: Sep. 4, 2007

(54) PROCESS AND DEVICE FOR CONTACTLESS MEASUREMENT OF ROTATIONAL SPEED

(75) Inventor: Franz Hrubes, Rotthalmünster (DE)

(73) Assignee: Micro-Epsilon Messtechnik GmbH & Co., Ortenburg (DE)

( * ) Notice: Subject to any disclaimer, the term of this patent is extended or adjusted under 35 U.S.C. 154(b) by 0 days.

(21) Appl. No.: 11/470,833

(22) Filed: Sep. 7, 2006

(65) Prior Publication Data
US 2007/0001663 A1    Jan. 4, 2007

Related U.S. Application Data

(63) Continuation of application No. PCT/DE2005/000396, filed on Mar. 7, 2005.

(30) Foreign Application Priority Data
Mar. 8, 2004   (DE) .............. 10 2004 011 536
Sep. 27, 2004  (DE) .............. 10 2004 047 116

(51) Int. Cl.
*G01B 7/14* (2006.01)
(52) U.S. Cl. ............. 324/207.26; 324/236; 324/207.12
(58) Field of Classification Search ................
324/207.11–207.26, 236, 228; 331/65; 361/179–181
See application file for complete search history.

(56) References Cited

U.S. PATENT DOCUMENTS

| 4,021,681 A | 5/1977 | Miesterfeld et al. |
| 4,088,022 A | 5/1978 | Kalotay et al. |
| 4,453,145 A | 6/1984 | Schuster et al. |
| 4,459,561 A | 7/1984 | Clark et al. |
| 4,754,862 A | 7/1988 | Rawicz-Szczerbo et al. |
| 5,041,856 A | 8/1991 | Veronesi et al. |
| 6,208,134 B1 * | 3/2001 | Demma .................. 324/207.26 |

FOREIGN PATENT DOCUMENTS

| DE | 26 49 366 A1 | 5/1978 |
| DE | 42 12 363 A1 | 10/1993 |
| DE | 36 00 022 C2 | 7/1997 |
| EP | 0 697 769 A | 2/1996 |
| EP | 0 759 657 A | 2/1997 |
| GB | 2 217 859 A | 11/1989 |
| WO | WO98/05919 A | 2/1998 |

* cited by examiner

*Primary Examiner*—Reena Aurora
(74) *Attorney, Agent, or Firm*—Alston & Bird LLP

(57) ABSTRACT

A process and a device for contactless measurement of rotational speed with a proximity sensor operating according to the eddy current principle. The proximity sensor comprises an inductor and a capacitor connected in parallel that form an oscillating circuit which can be excited from outside, and where the resonant frequency of the oscillating circuit experiences a detectable change when an object to be measured approaches the proximity sensor. In various embodiments, the resonant frequency of the oscillating circuit or the excitation frequency of the oscillating circuit is controlled as a reaction to slow changes of the resonant frequency in such a manner that the oscillating circuit is always excited with its resonant frequency or with a frequency close to its resonant frequency and that rapid changes are detected as a measurement signal for the measurement of rotational speed.

15 Claims, 6 Drawing Sheets

US 7,265,542 B2

PROCESS AND DEVICE FOR CONTACTLESS MEASUREMENT OF ROTATIONAL SPEED

CROSS REFERENCE TO RELATED APPLICATION

The present application is a continuation of international application PCT/DE 2005/000396, filed 7 Mar. 2005, and which designates the U.S. The disclosure of the referenced application is incorporated herein by reference.

BACKGROUND OF THE INVENTION

The invention relates to a process and a device for contactless measurement of rotational speed with a proximity sensor operating according to the eddy current principle, where the proximity sensor comprises an inductor and a capacitor connected in parallel that form an oscillating circuit which can be excited from outside, and where the resonant frequency of the oscillating circuit experiences a detectable change when an object to be measured approaches the proximity sensor.

According to experience, the most advantageous measurement principle for contactless measurement of rotational speed of rapidly rotating turbines, especially of turbochargers, is the acquisition of data from each individual turbine blade by a sensor operating according to the eddy current principle. The advantages of a process of this type follow from, among other things, the fact that, for one thing, a measurement signal is present even at extremely low rotational speeds and, for another thing, the highest permissible rotational speed is theoretically unbounded. This is important since with modern turbochargers, depending on the size of the charger, rotational speeds of up to 400,000 revolutions per minute are to be expected. With that rotational speed, the circumferential speed at the outer diameter of the rotors is over 600 m/s. In addition, the measurement takes place almost without delay.

Additional advantages of a contactless measurement process according to the eddy current principle are due to the fact that the degree of efficiency of the turbocharger is not affected and only a minimum intervention in the geometry of the charger is required. In addition to this, the principle of measurement is not sensitive to dirt, no sealing problems occur, and the temperatures of −40° C. to 200° C. occurring on the compressor side of the turbocharger can be managed without difficulty.

Turbines in general as well as turbochargers in particular are, depending of the field of application, known in the most varied sizes. Charger sizes range in the normal case from a compressor wheel diameter of approximately 25 mm in small passenger vehicle motors to over 200 mm in commercial vehicles. Along with this, current blade thicknesses range from approximately 0.2 mm up to 2 mm. From these stated dimensions, the resulting detection distances between the individual blades are approximately 0.2 mm up to 2 mm.

In addition to the different geometries, dimensions, and rating of the existing turbochargers, differences in the material composition are to be taken into account. While in most turbochargers the blades are made of aluminum, titanium is coming into use to an increasing extent. In the normal case the sensor design must thus be adapted to the particular form of construction and to the particular material composition of the turbocharger. An inadequate adaptation of the sensor design to the particular circumstances of measurement can, under certain circumstances, lead to a sharp decrease in the precision of measurement.

The objective of the present invention is to specify a process and a device for contactless measurement of rotational speed of the type stated in the introduction with which a measurement of rotational speed is possible for a plurality of different geometries of the objects to be investigated and with sensitivity remaining nearly constant.

SUMMARY OF THE INVENTION

The above objectives and others are realized according to the invention by providing, in one embodiment, a process for contactless measurement of rotational speed with a proximity sensor operating according to the eddy current principle, the process comprising providing a proximity sensor that comprises an inductor and a capacitor connected in parallel that form an oscillating circuit which can be excited from outside, and where a resonant frequency of the oscillating circuit experiences a detectable change when an object to be measured approaches the proximity sensor, and controlling the resonant frequency of the oscillating circuit or an excitation frequency of the oscillating circuit as a reaction to slow changes of the resonant frequency in such a manner that the oscillating circuit is always excited with its resonant frequency or with a frequency close to its resonant frequency and that rapid changes are detected as a measurement signal for the measurement of rotational speed.

According thereto, such a process is characterized by the fact that the resonant frequency of the oscillating circuit and/or the excitation frequency of the oscillating circuit are controlled in such a manner that the oscillating circuit is always excited with its resonant frequency or with a frequency close to its resonant frequency.

In another embodiment, the present invention provides a device for contactless measurement of rotational speed, comprising a proximity sensor operating according to the eddy current principle, where the proximity sensor comprises an inductor and a capacitor connected in parallel that form an oscillating circuit which can be excited from outside, and where a resonant frequency of the oscillating circuit experiences a detectable change when an object to be measured approaches the proximity sensor, wherein the resonant frequency of the oscillating circuit or the excitation frequency of the oscillating circuit is controlled as a reaction to slow changes of the resonant frequency in such a manner that the oscillating circuit is always excited with its resonant frequency or with a frequency close to its resonant frequency and that rapid changes are detected as a measurement signal for the measurement of rotational speed.

According thereto, a device for contactless measurement of rotational speed is characterized by the fact that the resonant frequency of the oscillating circuit and/or the excitation frequency of the oscillating circuit can be controlled in such a manner that the oscillating circuit is always excited with its resonant frequency or with a frequency close to its resonant frequency.

According to the invention, it has been recognized that the sensitivity of a measurement of rotational speed is dependent to a great extent on the fact that the proximity sensor is adapted in an optimal manner to the geometry and the material composition of the object to be investigated. Moreover, it has been recognized that, turning away from previous practice, according to which a plurality of different of sensor designs is needed for turbochargers with different geometry and rating, it is possible to achieve, with a single sensor design, high sensitivity which remains as constant as possible for measurements in different turbochargers. For this, the resonant frequency and/or the excitation frequency of the oscillating circuit is controlled according to the invention in such a manner that the oscillating circuit is always excited with its resonant frequency, or at least with a frequency close to its resonant frequency. Thus, the proximity sensor always operates in the range of its greatest sensitivity. The effects of manufacturing tolerances, different circumstances of installation, inductance tolerances caused by the installation, slow, temperature-related changes, long-term effects, etc. are thus compensated and eliminated while rapid changes, which are caused by the individual blades as they pass, are detected.

In one embodiment, the control of the resonant frequency and/or the excitation frequency is done in the sense of an adjustment. Adjustment offers the advantage that, with a suitable adjustment variable, a resonant frequency adaptation of high precision and sufficient speed can be carried out without an intervention from outside.

The oscillating circuit is excited in an advantageous manner by an oscillator. To detect the change of the resonant frequency the phase difference between the oscillator signal and the signal at the oscillating circuit can be measured. Specifically, the phase difference can be measured by means of a phase detector which could be formed in the simplest case as a multiplier. As a measurement signal a phase difference signal can then be supplied.

The phase difference signal can be compared to a theoretical value which is produced with a circuit element. In an advantageous manner, a theoretical value is supplied which corresponds to a phase difference of zero.

With regard to particularly high sensitivity, the coil quality in the oscillating circuit is to be taken into account in particular. Along with this, it is advantageous to choose the sensor coil and the sensor capacitor so that a change in the resonant frequency, where said change is caused by the approach of the turbine blade to the proximity sensor, is as large as possible.

In practice, the signal durations which occur with the highest rotational speed to be detected, smallest sensor, narrowest blade, and greatest detection distance lie approximately in the range of one microsecond. In order to be able to detect, during the demodulation of the signal at the oscillation circuit and without difficulty, a signal change within this interval of time of one microsecond, it is advantageous to choose the resonant frequency correspondingly high, that is, in an advantageous manner greater than 1 MHz. In practical operation a resonant frequency of ca. 3 MHz has been proven to be suitable.

With regard to the readjustment of the resonant frequency of the oscillating circuit, various approaches are conceivable. Thus, for example, it is possible to integrate into the oscillating circuit a controllable capacitor whose capacitance can be changed as a function of a reference value which results from the comparison between the phase difference signal and the theoretical value. The controllable capacitor can, for example, be a variable capacitance diode.

An additional possibility for readjustment of the resonant frequency of the oscillating circuit consists in connecting a controllable inductor whose inductance, as previously described in reference to the controllable capacitor, can also be changed. Both possibilities, controllable capacitor and controllable inductor, offer the advantage of continuous adjustment. The controllable inductor as well as the controllable capacitor can be integrated into the oscillating circuit in the sense of a parallel circuit as well as in the sense of a series circuit.

In the framework of a further specific form of embodiment, additional capacitors with unchangeable capacitances and/or coils with unchangeable inductances can be connected or disconnected. The connection or disconnection is also done as a function of the reference value from the comparison between the phase difference signal and theoretical value. Thereby adjustment of the resonant frequency in discrete increments is possible. Also in the case of this variant, parallel circuits and series circuits are both possible.

Along with the resonant frequency, the excitation frequency of the oscillating circuit can be changed as a function of the reference value formed by comparison of the phase difference signal and theoretical value, where, for this, the oscillator can be embodied specifically as a voltage-controlled or current-controlled oscillator. Alternatively, the oscillator can be a digital signal processor (DSP). Due to the high resolution of a DSP, the excitation frequency of the oscillating circuit can be adapted with high precision. The same holds for an embodiment of the oscillator as a DDS (direct digital synthesis) generator.

BRIEF DESCRIPTION OF THE DRAWINGS

Figure 1:
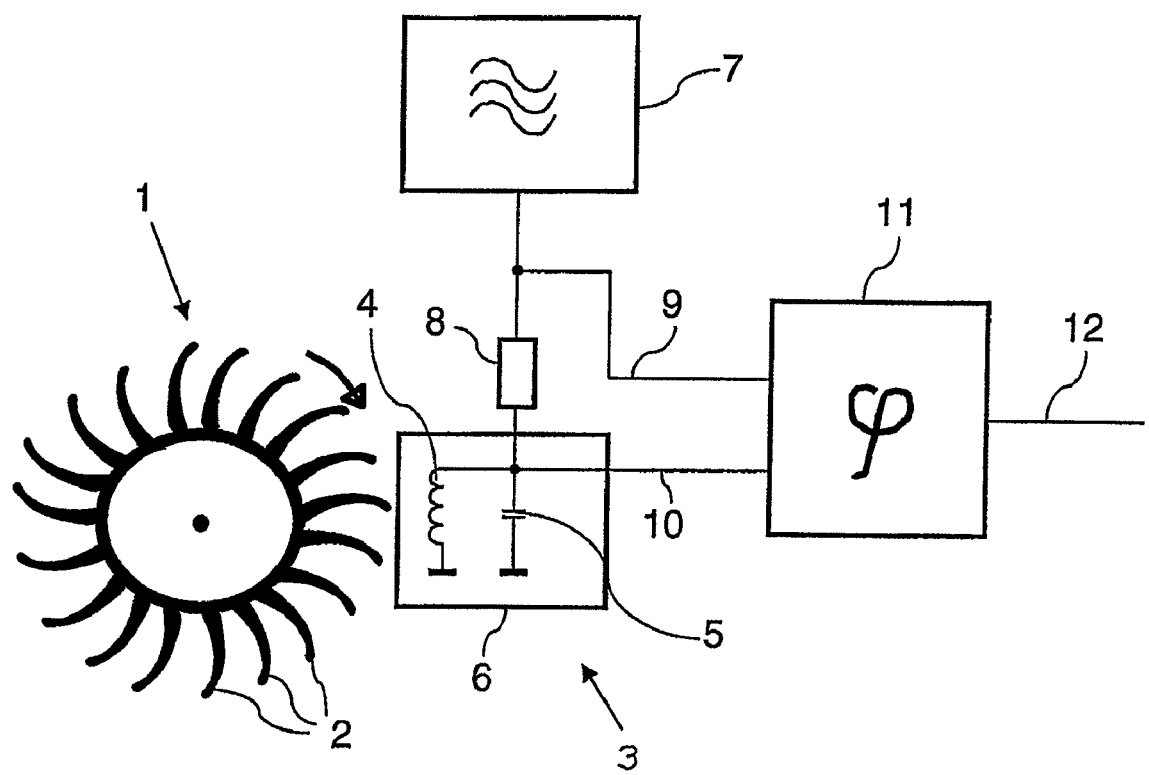
Figure 2:
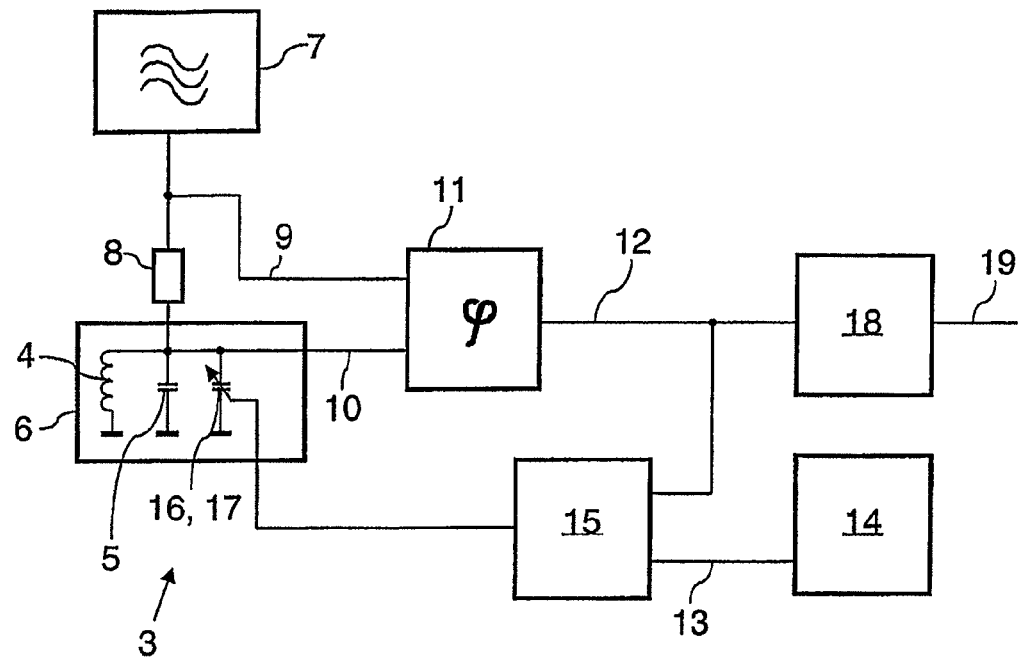
Figure 2:
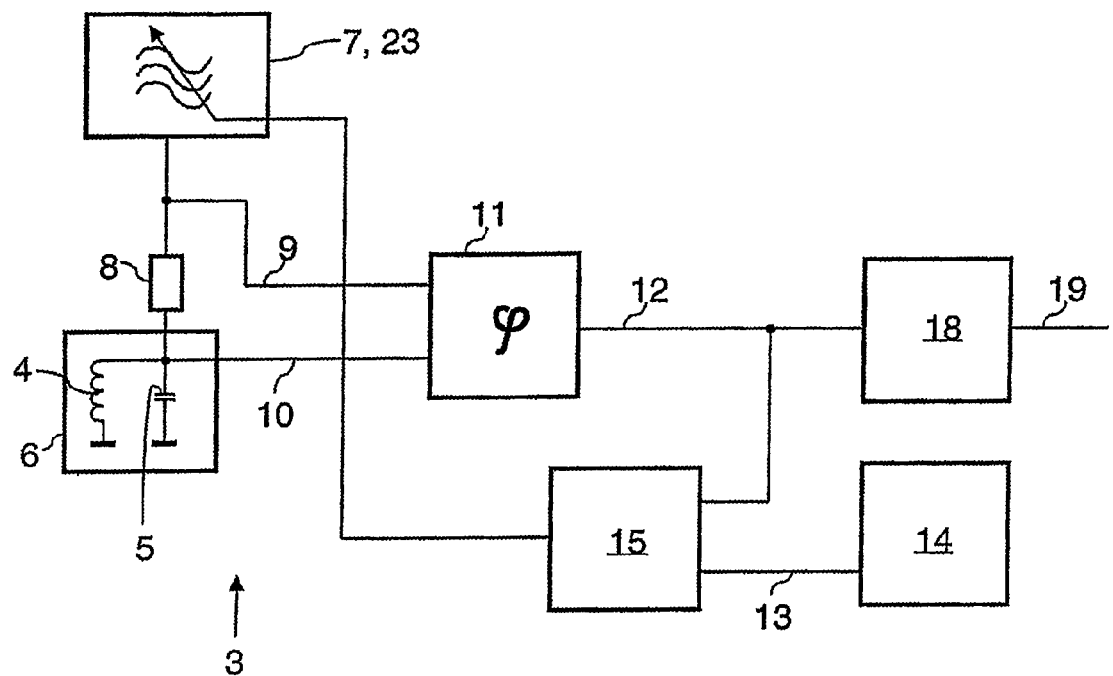
Figure 3:
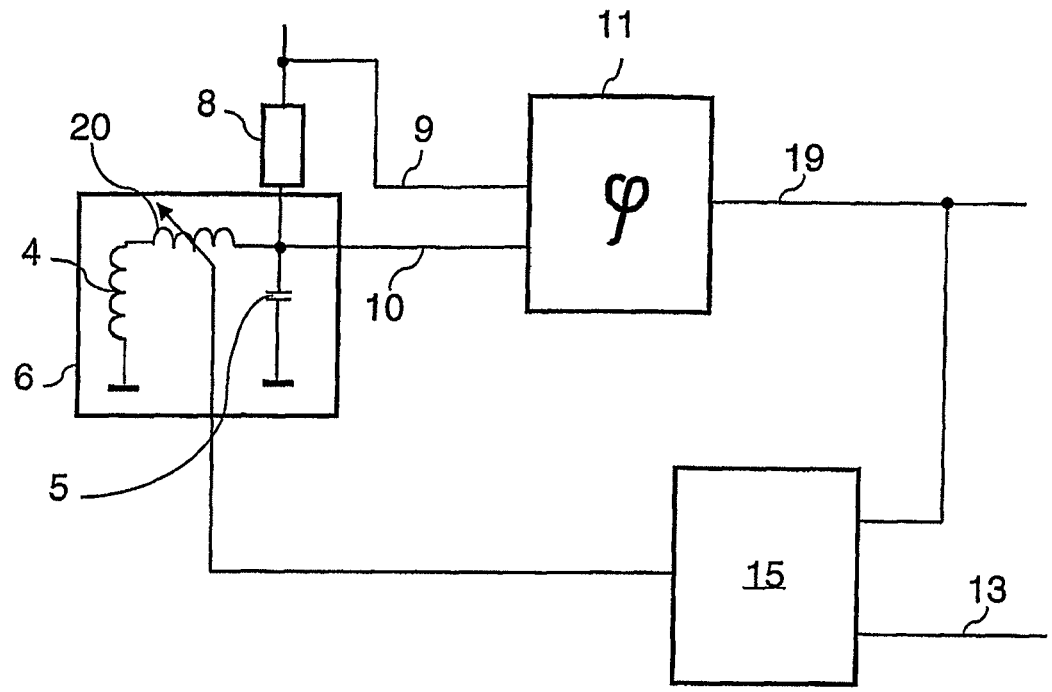
Figure 4:
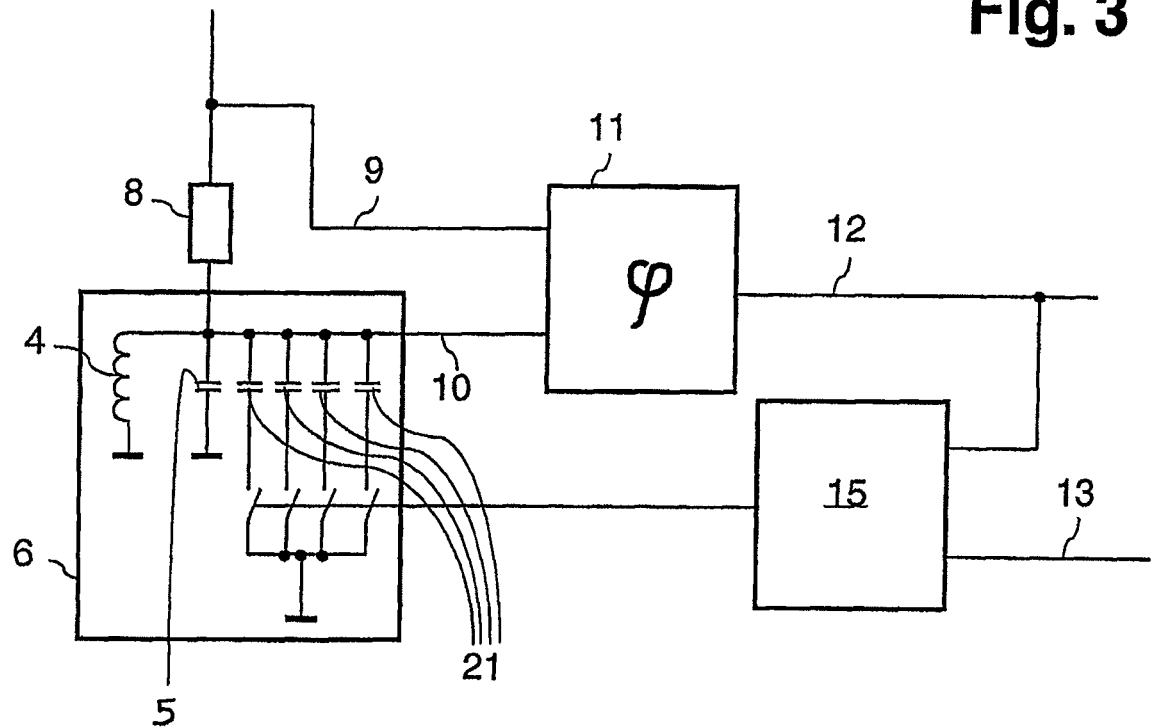
Figure 5:
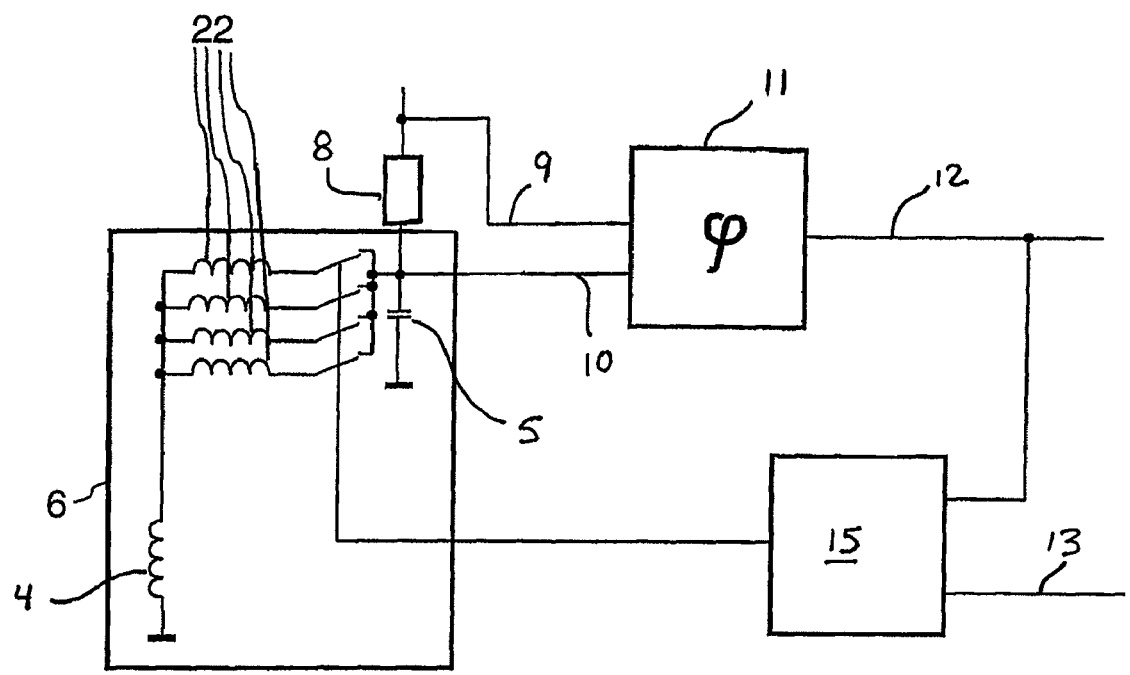
Figure 6:
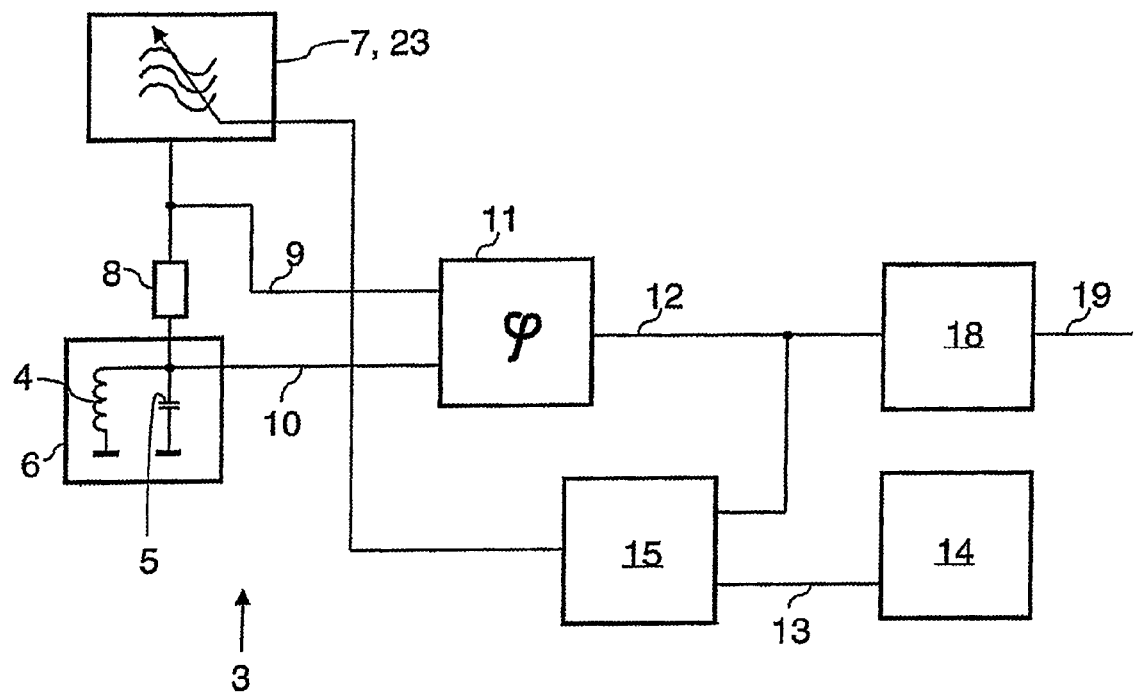
Figure 7:
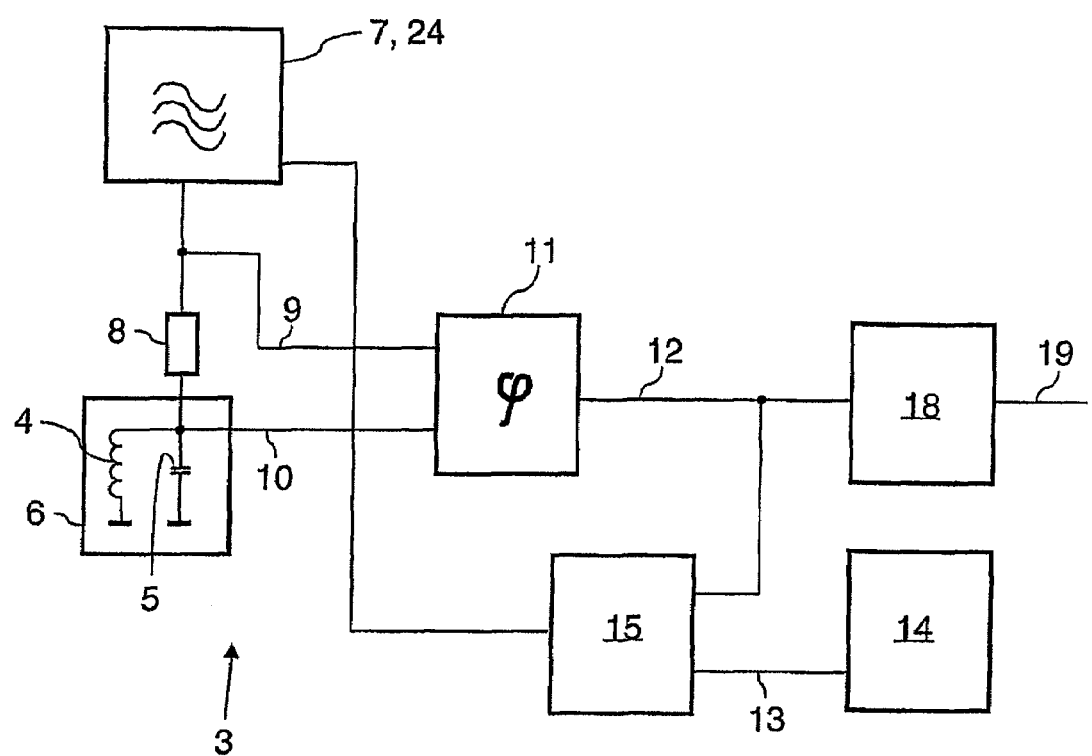

Having thus described the invention in general terms, reference will now be made to the accompanying drawings, which are not necessarily drawn to scale, and wherein:

FIG. 1 shows in a schematic view the basic design of an arrangement for contactless measurement of rotational speed with a proximity sensor operating according to the eddy current principle;

FIG. 2 shows schematically in a block diagram a first embodiment example of a device according to the invention and comprising a controllable capacitor;

FIG. 3 shows schematically in a block diagram a second embodiment example of a device according to the invention and comprising a controllable inductor;

FIG. 4 shows schematically in a block diagram a third embodiment example of a device according to the invention and comprising capacitors which can be connected;

FIG. 5 shows schematically in a block diagram a fourth embodiment example of a device according to the invention and comprising inductors which can be connected;

FIG. 6 shows schematically in a block diagram a fifth embodiment example of a device according to the invention and comprising a controllable oscillator; and FIG. 7 shows schematically in a block diagram a sixth embodiment example of a device according to the invention and comprising a digital signal processor.

DETAILED DESCRIPTION OF THE INVENTION

The present invention now will be described more fully hereinafter with reference to the accompanying drawings, in which some, but not all embodiments of the invention are shown. Indeed, the present invention may be embodied in many different forms and should not be construed as limited to the embodiments set forth herein; rather, these embodiments are provided so that this disclosure will satisfy applicable legal requirements. Like numbers refer to like elements throughout.

FIG. 1 shows schematically the basic design of an arrangement for contactless measurement of rotational speed according to the eddy current principle. Represented therein is a rotating turbine 1 of a turbocharger. At a distance from the blades 2 of the turbine 1 a proximity sensor 3 is positioned which comprises a coil 4 and a parallel capacitor 5. The coil 4 and parallel capacitor 5 form an oscillating circuit 6 whose resonant frequency is chosen so that a change in the resonant frequency, where said change is caused by the approach of the charger blade 2, is as large as possible.

The oscillating circuit 6 is excited by an oscillator 7. The oscillating circuit 6 is supplied with the oscillator signal via an impedance 8. The impedance 8 is preferably realized by an ohmic resistance. However, inductors or capacitors or combinations of different impedances can also be used.

To detect the change in resonant frequency, the phase difference between the oscillator signal 9 and the signal 10 at the oscillating circuit 6 is measured using a phase detector 11. The phase detector 11 is embodied as an analog multiplier. At the output of the phase detector 11, a phase difference signal 12 is supplied for further processing.

FIG. 2 shows schematically a block diagram of a first embodiment example of a device according to the invention for contactless measurement of rotational speed. Components identical to those in FIG. 1 are denoted by the same reference numbers. The phase difference signal 12 supplied at the output of the phase detector 11 is compared to a theoretical value 13. The theoretical value 13 is produced using a circuit element 14 and corresponds to the phase difference zero. In case of deviations of the phase difference signal 12 from the theoretical value 13 an adjustment or control circuit 15 readjusts or recontrols the resonant frequency of the oscillating circuit 6 until the phase difference is once again zero or close to zero. When the individual blades 2 of the turbine 1 pass in normal operation, an average phase deviation results, which is also compensated to zero by the adjustment or control circuit 15. Thus the greatest possible sensitivity is always automatically set, independently of all the factors acting in the particular actual individual case. The measurement process thus permits using a proximity sensor 3 of relatively small form in a plurality of different turbochargers.

To change the resonant frequency of the oscillating circuit 6, said oscillating circuit 6 is expanded by a controllable capacitor 16. The controllable capacitor 16, which is embodied as a variable capacitance diode 17, is connected in parallel in the embodiment example represented, where a series circuit is also conceivable. According to the invention, the required adjustment or control time lies, in the optimal case, in the range of ca. 0.1 to 1 seconds. Rapid changes in phase, which occur in the passing of a blade 2, are processed further by a suitable circuit 18 to form the actual measurement signal 19.

With an extract, FIG. 3 shows basically the same design as in FIG. 2. In contradistinction to the form of embodiment according to FIG. 2, the adjustment or control of the resonant frequency of the oscillating circuit 6 is not done via a variable capacitance diode 17 but rather via a controllable inductor 20. The inductor 20 is connected in series, where connection in parallel is also possible here.

FIG. 4 shows an additional embodiment example in which the resonant frequency of the oscillating circuit 6 is also adjusted or controlled. In contradistinction to the embodiment examples according to FIG. 2 and FIG. 3, in which a continuous change of the resonant frequency of the oscillating circuit 6 is possible, in the embodiment example shown in FIG. 4, a change of the resonant frequency is realized in discrete increments. For this, the oscillating circuit 6 is expanded by a plurality of capacitors 21, where the capacitance of each cannot be changed. For readjustment of the resonant frequency of the oscillating circuit 6 one or more of the capacitors 21 can be connected or disconnected as a function of the phase difference detected. A parallel circuit of the capacitors 21 is represented, where a series circuit or a combination or parallel and series circuitry is also possible here.

FIG. 5 shows basically the same approach as in the embodiment example according to FIG. 4, with the proviso that instead of the capacitors 21 additional coils 22 can be connected or disconnected. A form of embodiment in which the capacitors 21 which can be connected and the coils 22 which can be connected are combined is also conceivable. In any case, it is essential that, through the connection or disconnection of the capacitors 21 and/or the coils 22, the resonant frequency of the oscillating circuit 6 can be changed, in increments as fine as possible.

FIG. 6 shows an embodiment example in which not the resonant frequency of the oscillating circuit 6 but rather the oscillator frequency with which the oscillating circuit 6 is excited is changed. Therein, the oscillator 7 is formed as a voltage-controlled oscillator (VCO) 23. In other respects, the measurement process follows the process described in connection with FIG. 2.

Finally, FIG. 7 shows a form of embodiment in which a digital oscillator 7 is used to excite the oscillation circuit 6. Specifically, the digital oscillator 7 is embodied as a digital signal processor (DSP) 24. The DSP 24 permits carrying out the frequency adaptation with high resolution. Alternatively, the digital oscillator 7 can, for example, also be embodied as a DDS signal generator.

Many modifications and other embodiments of the invention set forth herein will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A process for contactless measurement of rotational speed with a proximity sensor operating according to the eddy current principle, said process comprising:

providing a proximity sensor that comprises an inductor and a capacitor connected in parallel that form an oscillating circuit which can be excited from outside, and where a resonant frequency of the oscillating circuit experiences a detectable change when an object to be measured approaches the proximity sensor; and controlling the resonant frequency of the oscillating circuit or an excitation frequency of the oscillating circuit as a reaction to slow changes of the resonant frequency in such a manner that the oscillating circuit is always excited with its resonant frequency or with a frequency close to its resonant frequency and that rapid changes are detected as a measurement signal for the measurement of rotational speed, wherein the resonant frequency is chosen to be high so that during a demodulation of a signal at the oscillation circuit, a change of the magnitude of the measurement signal within a predefined interval of time can be evaluated.

2. The process according to claim 1, wherein the controlling step is carried out in the sense of an adjustment.

3. The process according to claim 1, wherein the oscillating circuit is excited by an oscillator.

4. The process according to claim 3, wherein the detectable change of the resonance frequency is effected by measuring a phase difference between an oscillator signal and a signal at the oscillating circuit.

5. The process according to claim 4, wherein the phase difference is measured by means of a phase detector.

6. The process according to claim 5, wherein a phase difference signal is supplied at an output of the phase detector.

7. The process according to claim 6, wherein the phase difference signal is compared to a theoretical value.

8. The process according to claim 7, wherein the theoretical value corresponds to a phase difference of zero.

9. The process according to claim 1, wherein the resonant frequency is adjusted as a function of a deviation of a phase difference signal from a theoretical value by changing a capacitance of a connected, controllable capacitor.

10. The process according to claim 1, wherein the resonant frequency is adjusted as a function of a deviation of a phase difference signal from a theoretical value by changing an inductance of a connected, controllable inductor.

11. The process according to claim 1, wherein the resonant frequency is adjusted as a function of a deviation of a phase difference signal from a theoretical value by connecting or disconnecting additional capacitors and inductors.

12. The process according to claim 1, wherein an excitation frequency is changed as a function of a deviation of a phase difference signal from a theoretical value.

13. The process according to claim 1, wherein rapid changes of the resonant frequency of the oscillating circuit resulting from the object approaching or passing the proximity sensor are detected as a measurement signal for the measurement of rotational speed.

14. A device for contactless measurement of rotational speed, comprising:
   a proximity sensor operating according to the eddy current principle, where the proximity sensor comprises an inductor and a capacitor connected in parallel that form an oscillating circuit which can be excited from outside, and where a resonant frequency of the oscillating circuit experiences a detectable change when an object to be measured approaches the proximity sensor,
   wherein the resonant frequency of the oscillating circuit or the excitation frequency of the oscillating circuit is controllable as a reaction to slow changes of the resonant frequency in such a manner that the oscillating circuit is always excited with its resonant frequency or with a frequency close to its resonant frequency and that rapid changes are detected as a measurement signal for the measurement of rotational speeds,
   wherein the resonant frequency is chosen to be high so that during a demodulation of a signal at the oscillation circuit, a change of the magnitude of the measurement signal within a predefined interval of time can be evaluated.

15. The device according to claim 14, wherein rapid changes of the resonant frequency of the oscillating circuit resulting from the object approaching or passing the proximity sensor are detected as a measurement signal for the measurement of rotational speed.

* * * * *

UNITED STATES PATENT AND TRADEMARK OFFICE
CERTIFICATE OF CORRECTION

PATENT NO.       : 7,265,542 B2
APPLICATION NO.  : 11/470833
DATED            : September 4, 2007
INVENTOR(S)      : Hrubes It is certified that error appears in the above-identified patent and that said Letters Patent is hereby corrected as shown below:

Column 8,

Line 20, "speeds" should read --speed--.

Signed and Sealed this

Eleventh Day of December, 2007

JON W. DUDAS
*Director of the United States Patent and Trademark Office*